United States Patent [19]

Hagiwara

[11] Patent Number: 4,975,651
[45] Date of Patent: Dec. 4, 1990

[54] DIGITAL PHASE LOCKED LOOP CIRCUIT

[75] Inventor: Misao Hagiwara, Tokyo, Japan

[73] Assignee: NEC Corporation, Tokyo, Japan

[21] Appl. No.: 365,448

[22] Filed: Jun. 12, 1989

[30] Foreign Application Priority Data

Jun. 10, 1988 [JP] Japan ................. 65-144070

[51] Int. Cl.⁵ .................. H03K 5/22; H03L 7/00
[52] U.S. Cl. ........................... 328/155; 307/511
[58] Field of Search ............... 328/155; 377/39, 48;
307/511; 331/1 A, DIG. 2, 25

[56] References Cited

U.S. PATENT DOCUMENTS

| | | | |
|---|---|---|---|
| 3,621,403 | 3/1969 | Seiy | 377/39 |
| 3,629,503 | 4/1969 | Rempert | 328/155 |
| 3,952,253 | 4/1976 | Devolpi | 377/39 |
| 4,089,060 | 5/1978 | Mitchell | 377/39 |
| 4,573,176 | 2/1986 | Yeager | 377/48 |
| 4,606,058 | 8/1986 | Kruger | 377/39 |
| 4,780,895 | 10/1988 | Paul | 328/155 |

Primary Examiner—Stanley D. Miller
Attorney, Agent, or Firm—Helfgott & Karas

[57] ABSTRACT

A phase locked loop circuit for producing a control signal with a predetermined phase relationship to an input signal includes a first counter which counts a reference clock signal and is supplied from a control circuit with first and second signals. The first counter operates in a normal mode in which a count value is changed one by one when both, the first and second signals are not supplied, in a skip mode in which a first predetermined count value is skipped when the first signal is supplied, and in a repeat mode in which a second predetermined count value is repeated when the second signal is supplied. A second counter is provided, which perform a count operation in synchronism with the reference clock signal under the control of an output of the first counter to produce the control signal. The loop circuit further includes a phase comparator which produces phase difference data representative of a phase difference between the input signal and the control signal. The control circuit supplies the first and second signals to the first counter in response to the phase difference data to command the first counter so as to operate in one of the normal, skip and repeat modes a plurality of times during one cycle period of the control signal.

3 Claims, 5 Drawing Sheets

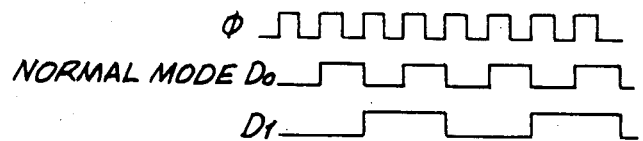
FIG.5A
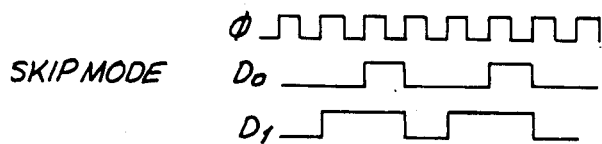
FIG.5B
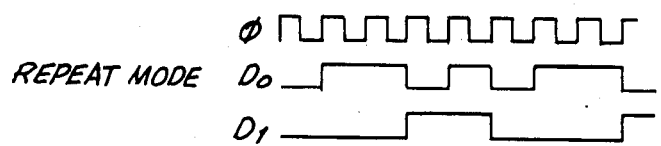
FIG.5C
| OUTPUT OF CKT 7 | S: SKIP MODE  N: NORMAL MODE  R: REPEAT MODE | | | | | | | |
|---|---|---|---|---|---|---|---|---|
| | ST0 | ST1 | ST2 | ST3 | ST4 | ST5 | ST6 | ST7 |
| −7 | S | N | S | S | S | S | S | S |
| −6 | S | N | S | S | S | S | S | N |
| −5 | S | N | S | S | S | S | N | N |
| −4 | S | N | S | S | S | N | N | N |
| −3 | S | N | S | S | N | N | N | N |
| −2 | S | N | S | N | N | N | N | N |
| −1 | S | N | N | N | N | N | N | N |
| 0 | N | N | N | N | N | N | N | N |
| +1 | R | N | N | N | N | N | N | N |
| +2 | R | N | R | N | N | N | N | N |
| +3 | R | N | R | R | N | N | N | N |
| +4 | R | N | R | R | R | N | N | N |
| +5 | R | N | R | R | R | R | N | N |
| +6 | R | N | R | R | R | R | R | N |
| +7 | R | N | R | R | R | R | R | R |
FIG.6

4,975,651

DIGITAL PHASE LOCKED LOOP CIRCUIT

BACKGROUND OF THE INVENTION

The present invention relates to a phase locked loop (called hereinafter "PLL") circuit and, more particularly, to a digital PLL circuit for producing a control signal which is locked in a predetermined phase relationship to an input signal supplied with a variable phase.

A digital PLL circuit employed in a data processing sytem requiring a control signal locked in a predetermined phase relationship to an input signal having a variable and arbitrary phase, includes an oscillator, a variable divider, a phase comparator and a control circuit. The oscillator generates a reference clock signal of a constant frequency higher than the frequency of the input signal. The divider frequency-divides the reference clock signal in accordance with a division ratio to produce the control signal. The comparator compares the phase of the control signal with the phase of the input signal and produces phase difference data representative of a phase difference therebetween. The control circuit controls the division ratio of the divider in response to the phase difference data such that the control signal takes a predetermined phase relationship to the input signal.

The digital PLL circuit is required to control the phase of the control signal in such a manner that a phase error between the input and control signals is in a range of one clock cycle of the reference clock signal with a simplified construction. It is further required to easily change a loop gain of the circuit.

SUMMARY OF THE INVENTION

Therefore, an object of the invention is to provide an improved digital PLL circuit which can satisfy the above requirements.

Another object of the present invention is to provide a digital PLL circuit to which a microprogram control technique is applicable.

According to the present invention, there is provided a PLL circuit for producing a control signal with a predetermined phase relationship to an input signal, which includes a first counter counting a reference clock signal and supplied with first and second signals, the first counter operating in a normal mode in which a count value thereof is changed one by one when both of the first and second signals are not supplied, in a skip mode in which a first predetermined count value is skipped when the first signal is supplied, and in a repeat mode in which a second predetermined count value is repeated when the second signal is supplied, a second counter performing a count operation in synchronism with the reference clock signal under the control of an output of the first counter to produce the control signal, a phase comparator producing phase difference data representative of a phase difference between the input signal and the control signal, and a control circuit operatively supplying the first and second signals to the first counter in response to the phase difference data to command the first counter to operate in at least one of the normal, skip and repeat modes a plurality of times during one cycle of the control signal.

BRIEF DESCRIPTION OF THE DRAWINGS

FIGS. 5A, 5B and 5C are timing charts representative of normal, skip and repeat modes of a first counter shown in FIG. 1, respectively;

FIG. 6 is a diagram representative of an operation of a counter control circuit shown in FIG. 1;

DETAILED DESCRIPTION OF THE PREFERRED EMBODIMENT

Figure 1:
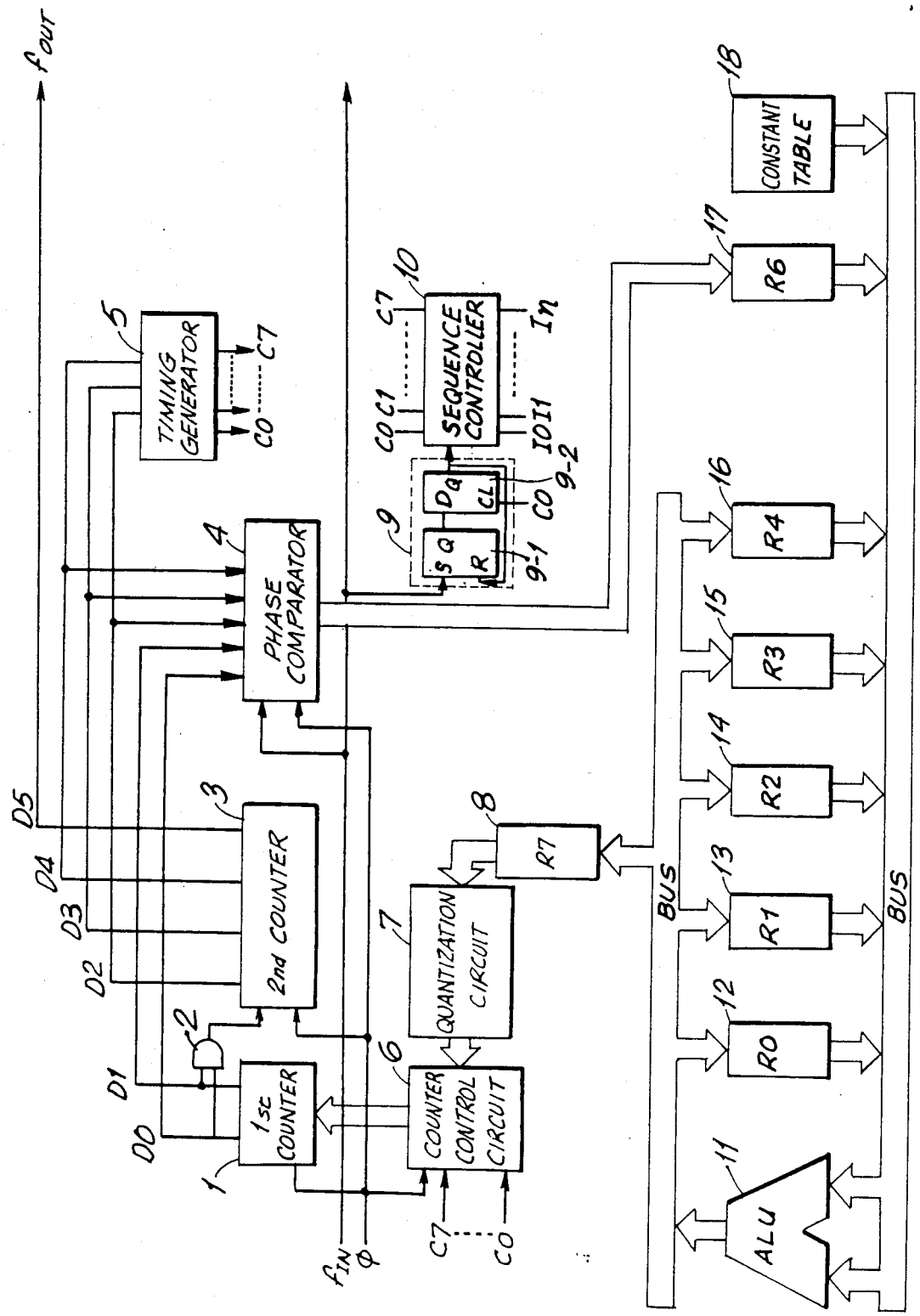
FIG. 1 is a block diagram representative of an embodiment of the present invention.

Referring to FIG. 1, a digital PLL circuit according to an embodiment of the present invention includes a 2-bit binary counter 1, an AND gate 2, a 4-bit binary counter 3, a phase comparator 4, a timing generator 5, a counter control circuit 6 for controlling a count value of the counter 1, a quantization circuit 7, seven registers 8 and 12 to 17, an input detector 9 having an S-R flip-flop 9-1 and D-type flip-flop 9-2, a sequence controlled 10, an arithmetic and logic unit (ALU) 11, and a constant table memory 18 for storing a constant used in an arithmentic operation, which are connected as shown.

Figure 2:
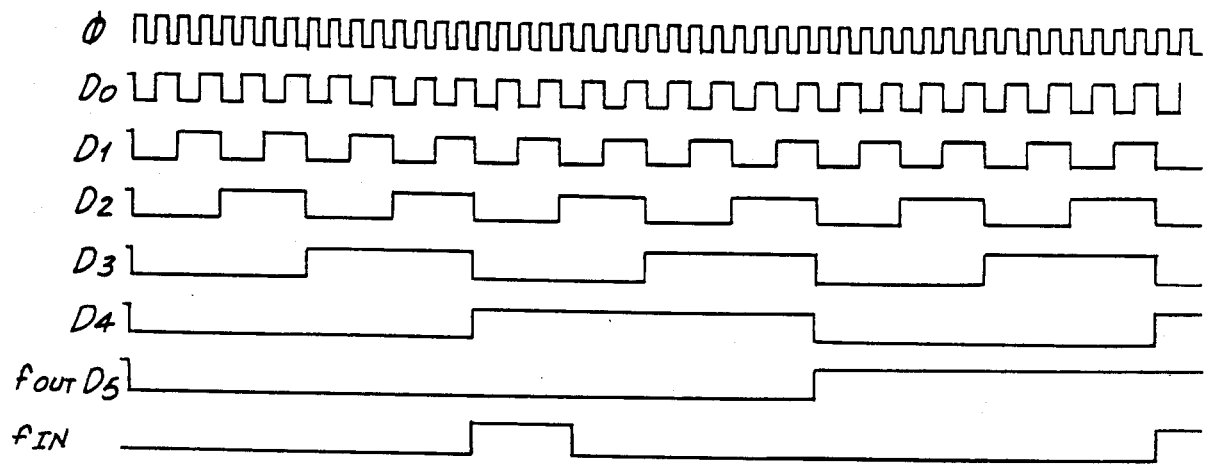
FIG. 2 is a timing chart representative of counters shown in FIG. 1.

When the circuit 6 designates the counter 1 to a normal mode, the counters 1 and 2 performs a count operation shown in FIG. 2. Each of the counter 1 and 2 changes its count value in synchronism with the leading edge of a reference clock signal $\phi$ which, is generated by a reference oscillator (not shown). The outputs $D_0$ and $D_1$ of the counter 1 are supplied to the AND gate 2 whose output is in turn supplied to the counter 3 to control the count operation thereof. When the leading edge of the reference clock $\phi$ appears durint the high level period of the AND gate 2, the counter 3 increments the count value thereof by one. The counter 3 produces four outputs $D_2$ to $D_5$, the output $D_4$ of which is controlled to take a predetermined phase relationship to an input signal $f_{IN}$. The circuit shown in FIG. 1 is employed as a digital PLL circuit for a floppy disk controller, and hence the output $D_5$, which has a half frequence of the output $D_4$, is led out as a window signal $f_{OUT}$. This signal $f_{OUT}$ is used for reproduce or extract data bit from the input signal $f_{IN}$.

Figure 7:
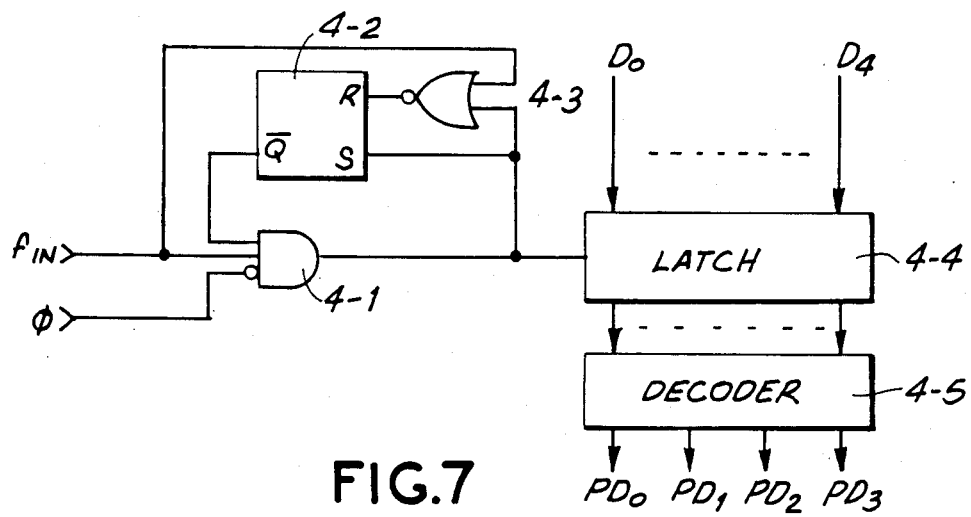
FIG. 7 is a block diagram representative of a phase comparator shown in FIG. 1.

The outputs $D_0$ to $D_4$ of the counters 1 and 2 are supplied to the phase comparator 4. As shown in FIG. 7, the phase compartor 4 includes an AND gate 4-1, an S-R flip-flop 4-2 a NOR gate 4-3, a latch circuit 4-4 and a decoder 4-5. Therefore, the count value represented by the outputs $D_0$ to $D_4$ are latched in the latch circuit 4-4 in response to the leading edge of the input signal $f_{IN}$. Since the counters 1 and 2 change the count value synchronism with the leading edge of the clock $\phi$, a latch-enable pulse to the latch circuit 4-4 is produced in synchronism with the falling edge of the clock $\phi$. The count value latched by the latch circuit 4-4 is supplied to a decoder 4-5 which thereby produces phase difference data $PD_0$ to $PD_3$ representative of a phase difference between the input signal $f_{IN}$ and the output $D_4$ or $D_5$. In the present description, the output $D_4$ is controlled such that the leading edge thereof is coincident with the leading edge of the input signal $f_{IN}$. Accordingly, the decoder 4-5 produces the phase difference data $PD_0$ to $PD_3$ in response to the latched data, as shown in the following TABLE-1:

TABLE-1

| $D_0$ | $D_1$ | $D_2$ | $D_3$ | $D_4$ | $PD_0$ | $PD_1$ | $PD_2$ | $PD_3$ |
|---|---|---|---|---|---|---|---|---|
| 1 | 0 | 0 | 1 | 0 | 1 | 0 | 0 | 1 |
| 0 | 1 | 0 | 1 | 0 | 0 | 1 | 0 | 1 |
| 1 | 1 | 0 | 1 | 0 | 1 | 1 | 0 | 1 |
| 0 | 0 | 1 | 1 | 0 | 0 | 0 | 1 | 1 |
| 1 | 0 | 1 | 1 | 0 | 1 | 0 | 1 | 1 |
| 0 | 1 | 1 | 1 | 0 | 0 | 1 | 1 | 1 |
| 1 | 1 | 1 | 1 | 0 | 1 | 1 | 1 | 1 |
| 0 | 0 | 0 | 0 | 1 | 0 | 0 | 0 | 0 |
| 1 | 0 | 0 | 0 | 1 | 1 | 0 | 0 | 0 |
| 0 | 1 | 0 | 0 | 1 | 0 | 1 | 0 | 0 |
| 1 | 1 | 0 | 0 | 1 | 1 | 1 | 0 | 0 |
| 0 | 0 | 1 | 0 | 1 | 0 | 0 | 1 | 0 |
| 1 | 0 | 1 | 0 | 1 | 1 | 0 | 1 | 0 |
| 0 | 1 | 1 | 0 | 1 | 0 | 1 | 1 | 0 |
| 1 | 1 | 1 | 0 | 1 | 1 | 1 | 1 | 0 |

In TABLE-1, the bit $PD_3$ is used as a sign bit, so that a negative phase difference is denoted by a 2's complement number.

Figure 3:
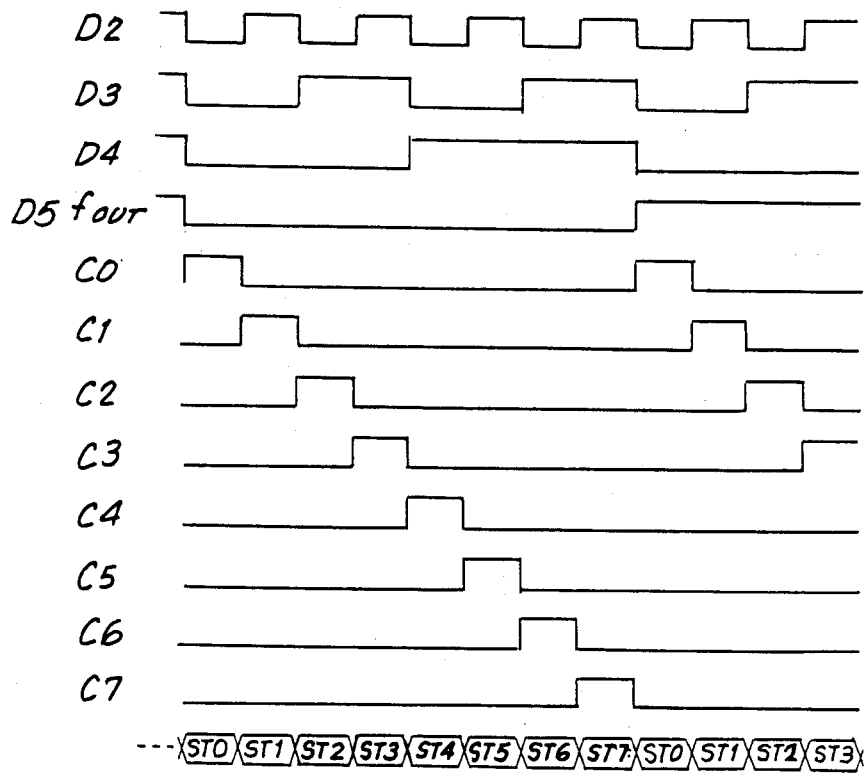
FIG. 3 is a timing chart representative of an operation of a timing generator shown in FIG. 1.

Turning back to FIG. 1, the outputs $D_0$ to $D_4$ from the counters 1 and 2 are supplied to the timing generator 5. The generator 5 generates eight timing signals $C_0$ to $C_7$ which are changed in sequence, as shown in FIG. 3. The signals $C_0$ to $C_7$ are used as state designation signals. That is, the high level periods of the signals $C_0$ to $C_7$ are designated to states STO to ST7, respectively. The timing signals $C_0$ to $C_7$ are supplied to the the sequence controller 10. The controller 10 responds to the signals $C_0$ to $C_7$ and produces control signals $I_0$ to $I_n$ to control the ALU 11, registers 8 and 12 to 17 and memory 18 such that a series of operations shown in FIG. 4 as a flow chart are executed. By these operations, phase control data is derived and the stored into the register 8. The quantization circuit 7 receives the phase control data and then produces one value of fifteen values of $-7, -6, -5, \ldots, +5, +6$ and $+7$.

The counter control circuit 6 controls the counter 1 such that the counter 1 operates in one of three modes consisting of a normal mode, a skip mode and a repeat mode. These modes are shown in FIGS. 5A to 5C as timing charts and are explained as follows: (1) Normal Mode (FIG. 5A):

The count value of the counter 1 is changed one by one; i.e., 0→1→2→3, in synchronism with the reference clock $\phi$.

(2) Skip Mode (FIG. 5B):

The count value of the counter 1 is changed in the order of 0→2→3. That is, count value 1 is skipped.

(3) Repeat Mode (FIG. 5C):

Count value 1 is repeated, so that the count value of the counter 1 is changed in the order of 0→1→1→2→3.

Figure 8:
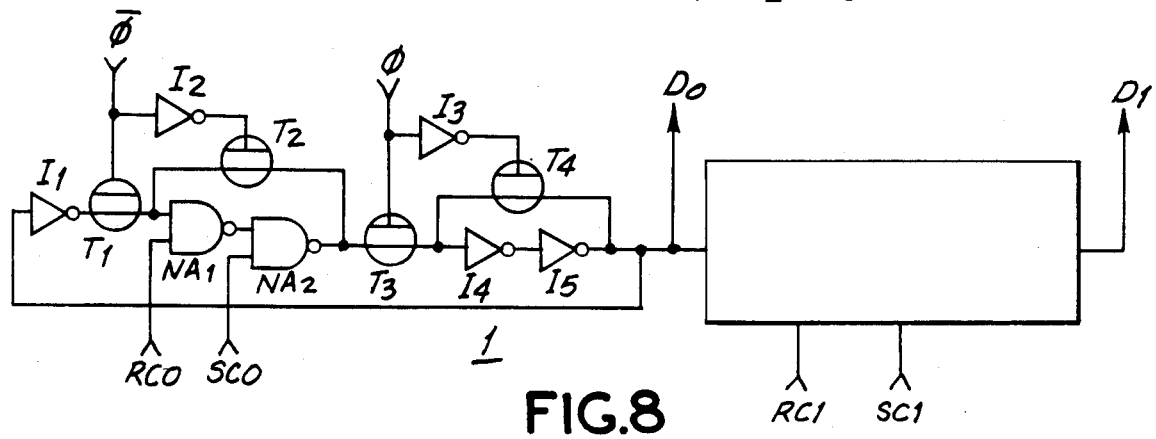
FIG. 8 is a circuit diagram representative of a first counter shown in FIG. 1.

As shown in FIG. 8, each bit of the counter 1 is of a master-slave type and consists of five inverters $I_1$ to $I_5$, four transfer gates $T_1$ to $T_4$ and two NAND gates $NA_1$ and $NA_2$, which are connected as shown. Accordingly, by the logic levels of two control signals RC and SC, the count value of the counter 1 can be controlled.

Although the count order of the counter 1 is changed as mentioned above, since the counter 2 increments the count value thereof by one in response to the leading edge of the clock $\phi$ during the high level period of the AND gate 2, the change in count value of the counter 2 is not disturbed. However, the period representative of each count value of the counter 2 is changed in accordance with the operation mode of the counter 1.

The timing signals $C_0$ to $C_7$ are further supplied to the counter control circuit 6. In response to the timing signals $C_0$ to $C_7$ and the output from the quantization circuit 7, the control circuit 6 controls the count operation mode of the counter 1 as shown in FIG. 6. For example, when the quantization circuit 7 produces an output of "$-7$", the control circuit 6 designates the skip mode operation to the counter 1 during seven states ST0 and ST2 to ST7, so that a half cycle of the output $f_{OUT}$ from the counter 2 is shortened by a period corresponding to seven clock pulses of the clock signal $\phi$. Similarly, the output of "$-6$" of the circuit 7 shortens the output $f_{OUT}$ by the period corresponding to the six clock pulses. The output of "$+5$" prolongs the output $f_{OUT}$ by the period corresponding to the five clock pulses.

Figure 4:
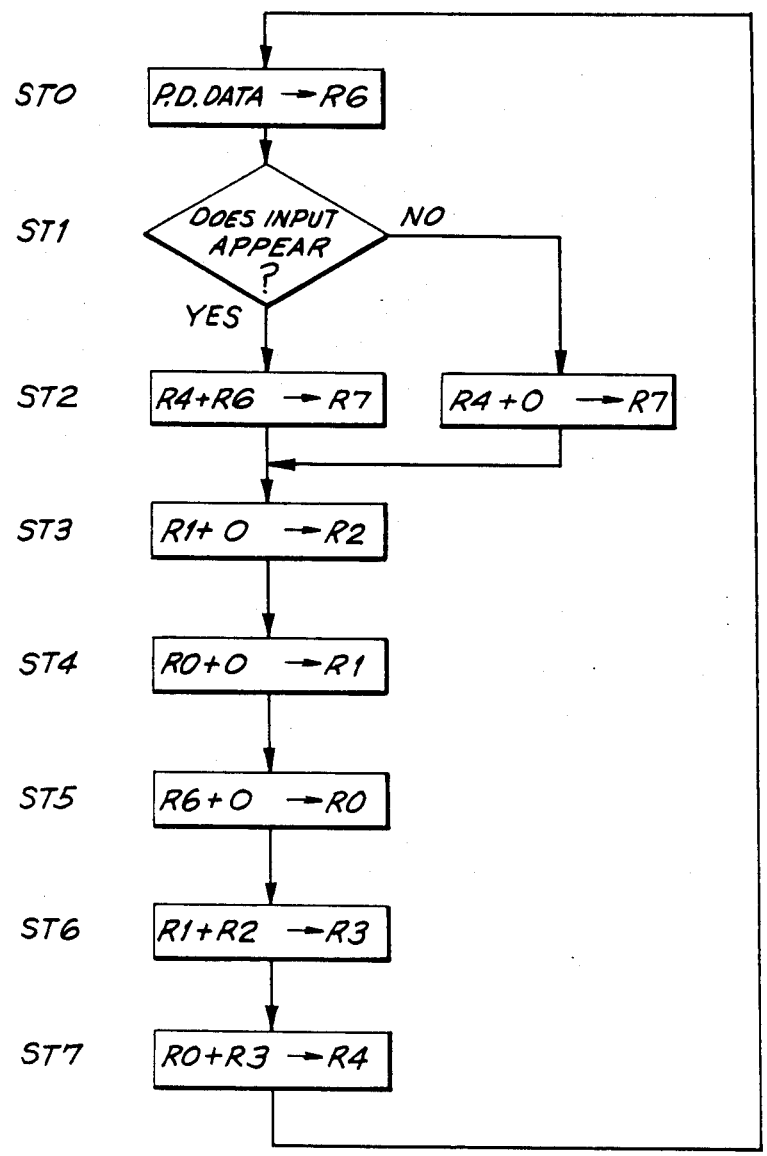
FIG. 4 is a flow chart executed by a sequence controller shown in FIG. 1.

Since the change in count value of the counter 3 is not disturbed, the timing generator 5 and the sequence controller 10 opertes normally, so that the operation flow shown in FIG. 4 is executed without problem. In the first state ST0, the phase difference data $PD_0$ to $PD_3$ from the phase comparator 4 are stored in the register 17. In the second state ST1, the output level of the flip-flop 9-2 is detected. If level "1" of the output of the flip-flop 9-2 is detected, the contents of the registers 16 and 17 are added and the resultant is loaded to the register 8, in the third state ST2. In the case where the output of the flip-flop 9-2 is detected to be "0", the content of the register 16 is loaded to the register 8. The content of the register 8 is add-resultant of preceding three phase difference data. The content of the register 17 represents the current phase difference data. Therefore, four phase difference data are added and supplied to the register 8. As a result, the phase of the signal $f_{OUT}$ is changed by the circuits 7 and 6. In the state, the content of the register 13 is loaded to the register 14, and the content of the register 12 is loaded to the register 13 in the state ST4. The content of the register R6 is thereafter loaded to the register 12 in the state ST5. The contents of the registers 13 and 14 are added and then loaded to the register 15, in the state ST6. Finally, in the state ST7, the contents of the registers 12 and 15 are added and then transferred to the register 16.

Figure 9:
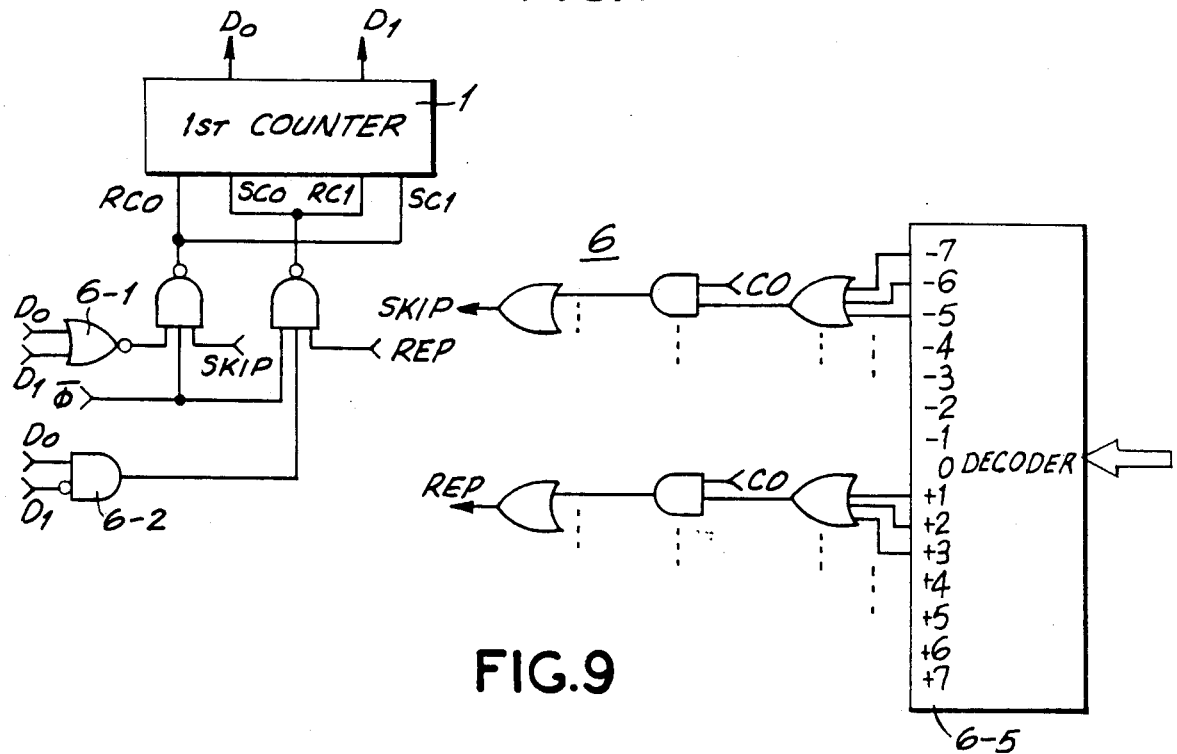
FIG. 9 is a circuit diagram representative of a counter control circuit shown in FIG. 1.

Referring to FIG. 9, the control circuit 6 includes a plurality of gates 6-1, 6-2, . . . and a decoder 5-6. In particular, the NOR gate 6-1 detects count value "0" ($D_0, D_1=0, 0$) of the counter 1 to control the skip operation. The AND gate 6-2 detects count value "1" ($D_0, D_1=1, 0$) of the counter 1 to control the repeat operation.

The present invention is not limited to the above embodiment, but may be modified and changed without departing from the scope and spirit of the invention. For example, by modifying the sequence controller 10, two phase difference data can be employed as data to be stored in the register 8.

What is claimed is:

1. A phase locked loop circuit for producing a control signal with a predetermined phase relationship to an input signal, comprising a first counter counting a reference clock signal and operating in a normal mode wherein a count value thereof is changed one by one when both of first and second signals are not supplied thereto, in a skip mode wherein a first predetermined count value is skipped when said first signal is supplied thereto and in a repeat mode wherein a second predetermined count value is repeated when said second signal is supplied thereto, a second counter performing a count operation in synchronism with said reference clock signal under control of an output of said first counter to produce said control signal, a phase comparator producing phase difference data representative of a phase difference between said control signal and said input signal, and control means responsive to said phase difference data for operatively producing said first and second signals to command said first counter to operate in at least one mode of said normal, skip and repeat modes a plurality of times during one cycle period of said control signal.

2. The circuit as claimed in claim 1, wherein said first and second predetermined count values are the same as each other.

3. The circuit as claimed in claim 1, further comprising means responsive to an output of said second counter for producing a plurality of state signals during one cycle of said control signal, said control means controls said first counter in accordance with said state signals.

* * * * *